United States Patent [19]
Kim et al.

[11] Patent Number: 5,872,035
[45] Date of Patent: Feb. 16, 1999

[54] METHOD OF FORMING A FLOATING GATE IN A FLASH MEMORY DEVICE

[75] Inventors: Myung Seon Kim; Sun Haeng Back, both of Kyoungkido, Rep. of Korea

[73] Assignee: Hyundai Electronics Industries Co., Ltd., Kyoungkido, Rep. of Korea

[21] Appl. No.: 834,398

[22] Filed: Apr. 16, 1997

[30] Foreign Application Priority Data

Jun. 29, 1996 [KR] Rep. of Korea .................. 1996-26485

[51] Int. Cl.$^6$ ................................. H01L 21/336
[52] U.S. Cl. .......................... 438/261; 438/257; 438/595
[58] Field of Search ................... 438/261, 296, 438/257, 595, 301, 367

[56] References Cited

U.S. PATENT DOCUMENTS

| | | | |
|---|---|---|---|
| 4,722,908 | 2/1988 | Burton | 438/564 |
| 4,997,790 | 3/1991 | Woo et al. | 438/595 |
| 5,026,663 | 6/1991 | Zdebel et al. | 438/367 |
| 5,070,032 | 12/1991 | Yuan et al. . | |
| 5,225,362 | 7/1993 | Bergemont | 438/261 |
| 5,266,509 | 11/1993 | CheN | 438/261 |
| 5,298,443 | 3/1994 | Jang | 438/301 |
| 5,453,391 | 9/1995 | Yiu et al. | 438/261 |

*Primary Examiner*—Charles Bowers
*Assistant Examiner*—Jack Chen
*Attorney, Agent, or Firm*—Jacobson, Price, Holman & Stern, PLLC

[57] ABSTRACT

The present invention provides a method to maintain a desired width of a floating gate of a flash memory device, so that the loss of the capability of storing charges is reduced. The method for forming a floating gate in a flash memory device containing a dielectric layer between said floating gate and a control gate, comprising the steps: forming field oxide layers in a semiconductor substrate; forming a gate oxide layer and a conductivity layer for said floating gate on said semiconductor substrate; forming a first oxide layer and a silicon nitride layer, in order, on said conductivity layer; forming a photoresist pattern; selectively etching said silicon nitride layer, said first oxide layer and said conductivity layer; forming source/drain regions by an ion implantation process; removing said photoresist pattern; forming a passivation layer on the resulting structure and forming a spacer layer on a sidewall of said floating gate by applying an isotropic etching process to said passivation layer so as to prevent said sidewall of said floating gate from being oxidized; forming a second oxide layer on said silicon nitride layer; and forming a control gate on the resulting structure.

2 Claims, 4 Drawing Sheets

METHOD OF FORMING A FLOATING GATE IN A FLASH MEMORY DEVICE

BACKGROUND OF THE INVENTION

1. Field of the Invention

This invention relates to a method for forming a flash memory device containing dielectric layers between a floating gate and a control gate, and more particularly to a method for forming a floating gate of the flash memory device without the loss of capability of storing charges.

2. Description of the Prior Art

Generally, a stacked gate of a flash memory device is formed by performing the steps of: forming a field oxide layer, a gate oxide, a polysilicon layer for a floating gate, a dielectric layer and a polysilicon layer for a control gate are formed, in order, on a silicon substrate; forming the polysilicon layer for the control gate; the dielectric layer and the polysilicon layer for the floating gate are selectively etched, so that the stacked gate pattern is formed. Herein, the dielectric layer is composed of a stacked layer including, a silicon oxide layer, a silicon nitride layer and a silicon oxide layer.

However, in the dry etching process for forming the stacked gate pattern, the substrate is damaged, so that the characteristics of the device are degraded.

A conventional method for forming a stacked gate of a flash memory device in order to solve the above mentioned problem is shown in FIGS. 1A to 1C.

First, referring to FIG. 1A, field oxide layers 12 are formed on a silicon substrate 11 by the thermal oxidation process and then a gate oxide layer 13 is formed. A polysilicon layer 14 for a floating gate is deposited on top of the gate oxide layer 13, and a silicon oxide layer 15 and a silicon nitride layer 16 are formed one by one on the polysilicon layer 14. A photoresist pattern 17, which is to be used as a mask of ion implanting and etching, is formed on the silicon nitride layer 16.

Referring next to FIG. 1B, the silicon nitride layer 16, the silicon oxide layer 15 and the polysilicon layer 14 are selectively etched, in order, using the photoresist patter 17 as an etching mask. N-type impurities, such as arsentc ions, are implanted into the silicon substrate 11, which is exposed by the anisotropic dry etching, to form source/drain regions(not shown) using the photoresist pattern 17 as an ion implantation mask.

Referring next to FIG. 1C, a silicon oxide layer 18 is formed on the silicon nitride layer 16 by the thermal oxidation process after removing the photoresist pattern 17. The silicon oxide layer, 18 can be replaced by an oxide layer which is formed in a high temperature atmosphere. A polysilicon layer 19 for a control gate is formed over the entire structure and a photoresist pattern 20 is formed to pattern a control gate. In the process of forming the silicon oxide layer 18, the exposed silicon substrate is also oxidized to form a silicon oxide layer 18', which is thicker than the silicon oxide layer 18 formed on the silicon nitride layer 16. Therefore, the silicon oxide layer 18' prevents the silicon substrate 11 from being damaged in the following dry etching process for forming the control gate pattern. On the other hand, the exposed sidewalls of the polysilicon layer 14 are also oxidized rapidly, so that an oxidized area 14' is formed in a part of the floating gate. As a result, the width of the floating gate is smaller than the desired width "A" by the width of the oxidized area 14'.

SUMMARY OF THE INVENTION

Therefore, the present invention has been made in view of the above mentioned problems, and an object of the present invention is to provide a method for forming a floating gate of a flash memory device, having no oxidized part of a floating gate.

In accordance with the present invention, there is disclosed a method for forming a floating gate in a flash memory device containing a dielectric layer between said floating gate and a control gate, comprising the steps: forming field oxide layers in a semiconductor substrate; forming a gate oxide layer and a conductivity layer for said floating gate on said semiconductor substrate; forming a first oxide layer and a silicon nitride layer, in order, on said conductivity layer; forming a photoresist pattern; selectively etching said silicon nitride layer, said first oxide layer and said conductivity layer; forming source/drain regions by an ion implantation process; removing said photoresist pattern; forming a passivation layer on the resulting structure and forming a spacer layer on a sidewall of said floating gate by applying an isotropic etching process to said passivation layer so as to prevent said sidewall of said floating gate from being oxidized; forming a second oxide layer on said silicon nitride layer; and forming a control gate on the resulting structure.

BRIEF DESCRIPTION OF THE DRAWINGS

These and other objects, features and advantages of the present invention will be more fully apparent from the description of the preferred embodiments with reference to the accompanying drawings, in which.

DETAILED DESCRIPTION OF THE PREFERRED EMBODIMENTS

A detailed description of an embodiment according to the present invention will be described below with reference to FIGS. 2A to 2C.

Figure 1A:
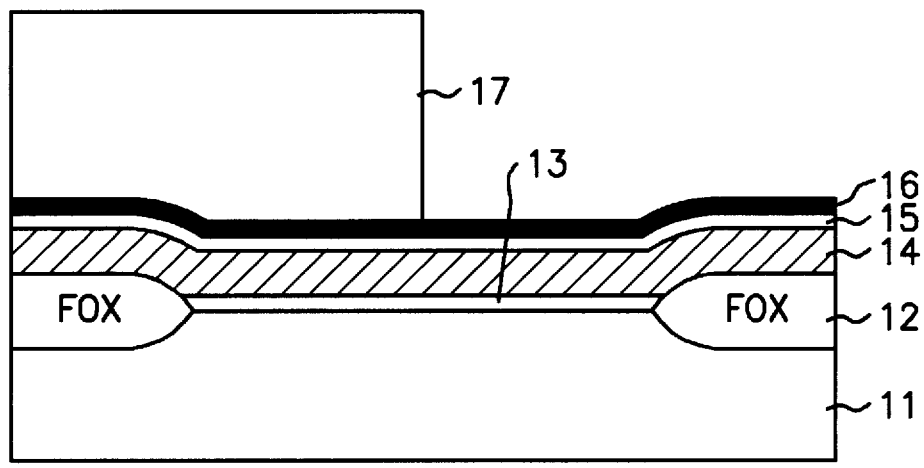
FIGS. 1A to 1C are cross sectional views of a conventional method for forming a stacked gate of a flash memory device.
Figure 1B:
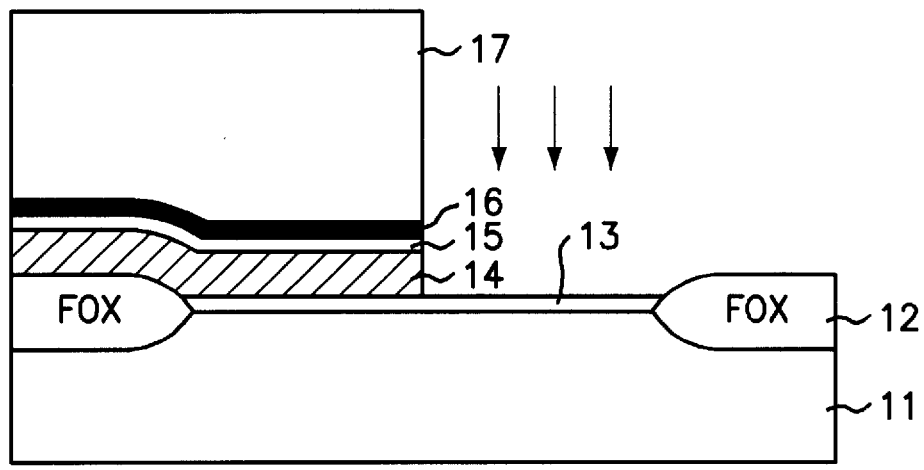
Figure 1C:
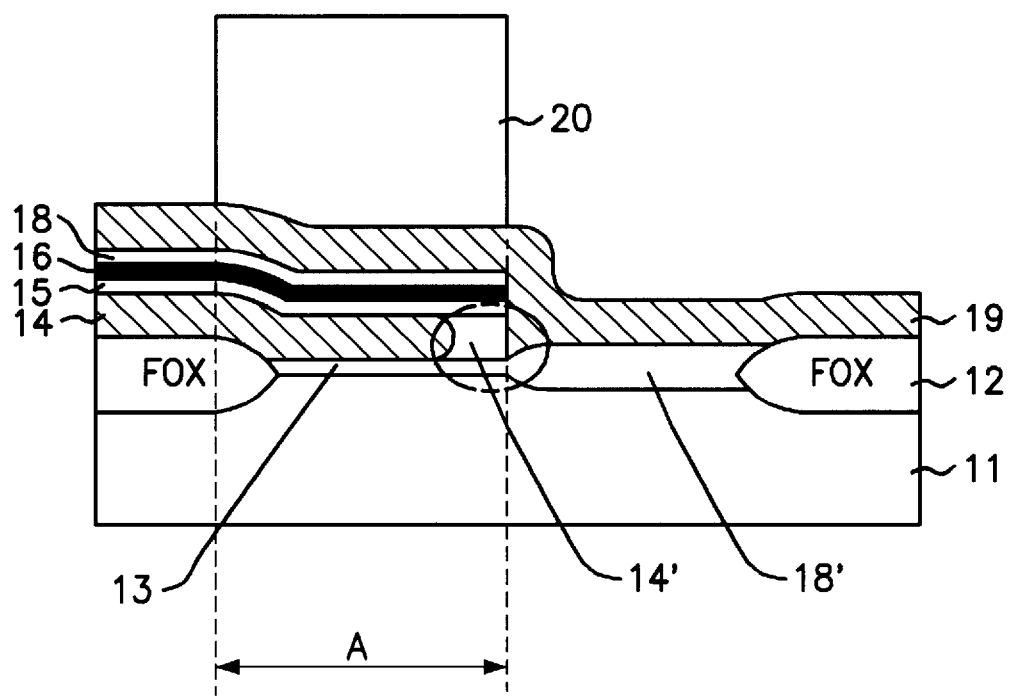
Figure 2A:
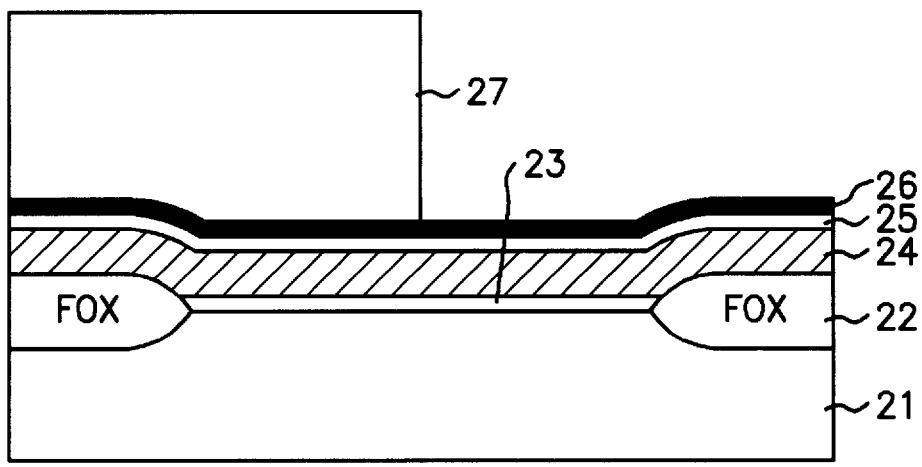
FIGS. 2A to 2C are cross sectional views of a method for forming a stacked gate of a flash memory device according to the present invention.

First referring to FIG. 2A, a field oxide layer 22 is formed on a silicon substrate 21 by the thermal oxidation process. A gate oxide layer 23 and polysilicon layer 24 for a floating gate are formed on the top of the gate oxide 23. A silicon oxide layer 25 and a silicon nitride layer 26 are formed. A photoresist pattern 27, which is to be used as an etching mask and an implantation mask, is formed on the silicon nitride layer 26.

Figure 2B:
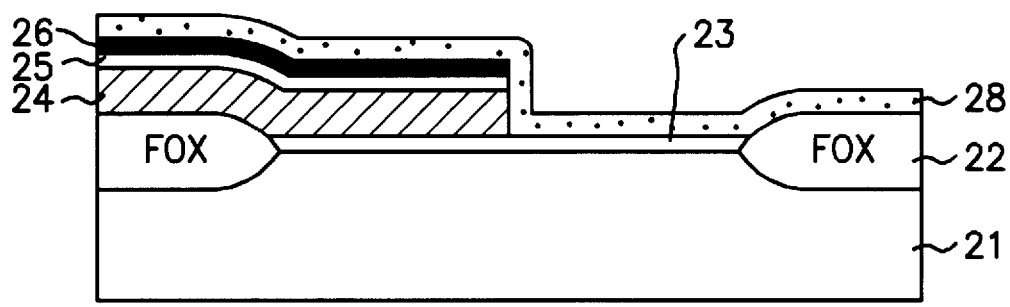

Referring next to FIG. 2B, the silicon nitride layer 26, the silicon oxide layer 25 and the polysilicon layer 24 are selectively etched one by one by the anisotropic dry etching process until the gate oxide layer 23 is exposed, using the photoresist pattern 27 as an etching mask. In the etching process, sidewalls of the polysilicon layer 24 for a floating gate is exposed. Thereafter, N-type impurities, such as arsenic ions, are implanted into the silicon substrate 21, which is selectively exposed by the anisotropic dry etching process, to form source/drain regions(not shown) using the photoresist pattern 27 as an ion implantation mask. An undoped polysilicon layer 28 is deposited over the entire structure to prevent the sidewalls of the polysilicon layer from being oxidized. Herein, a doped polysilicon layer can be deposited instead of the undoped polysilicon layer 28, but in this case, the doped polysilicon is formed to a thickness of a few thousand angstrom. A silicon nitride layer or an oxide layer, which is formed in a low temperature atmosphere, can be substituted for the undoped polysilicon layer.

Figure 2C:
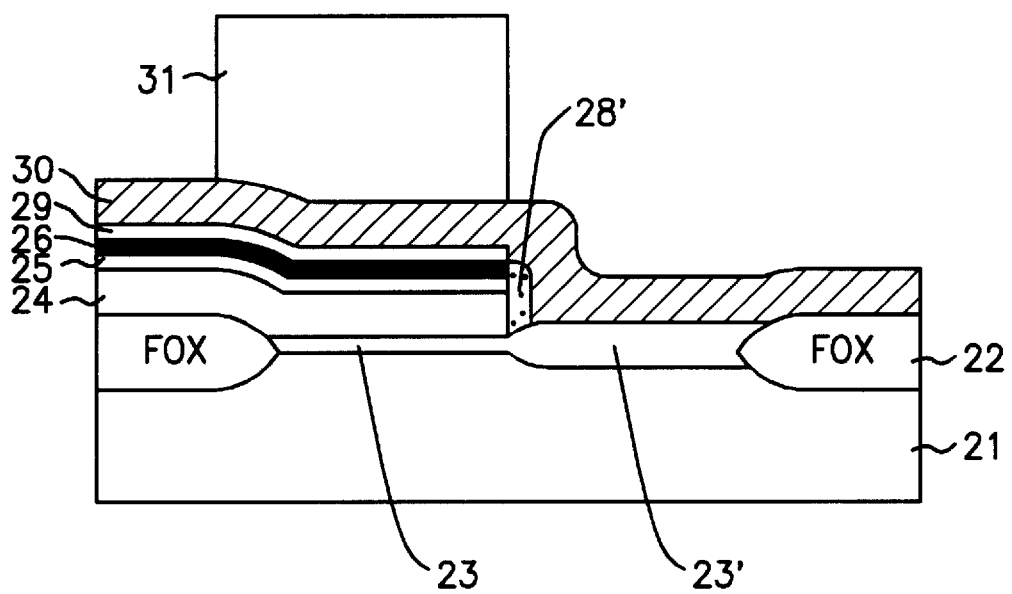

Finally, referring to FIG. 2C, the undoped polysilicon layer 28 is etched anisotropically without an etching mask, so that a spacer layer 28' is formed on the sidewalls of the layers 24, 25 and 26. A silicon oxide layer 29 is formed on the silicon nitride layer 26 by the thermal oxidation process and a polysilicon layer 30 for a control gate is formed on the resulting structure. A photoresist pattern 31 is formed on the polysilicon layer 30 to pattern the control gate. Herein, an oxide layer, which is formed in a high temperature atmosphere can be replaced with the silicon oxide layer 29.

Because the undoped polysilicon is oxidized very slowly, the spacer layer 28' formed with the undoped polysilicon prevents the sidewall of the polysilicon layer 24 from being oxidized in the following oxidation process, so that the desired pattern of the floating gate is obtained without the loss of the capability of storing charges and the degradation of the device.

In particular, since the spacer layer 28' has a slant, the quantity of the residue of polysilicon layer 30 may be reduced, preventing the residue from being connected to a metal interconnection line. As a result, the probability of a short circuit between the electrodes is diminished.

Although the preferred embodiments of the present invention have been disclosed for illustrative purposes, those skilled in the art will appreciate that various modifications, additions and substitutions are possible, without departing from the scope and the spirit of the present invention as disclosed in the accompanying claims.

What is claimed is:

1. A method for forming a floating gate in a flash memory device containing a dielectric layer between said floating gate and a control gate, comprising the steps:

forming field oxide layers in a semiconductor substrate;

forming a gate oxide layer and a conductivity layer for a floating gate on said semiconductor substrate;

forming a first oxide layer and a silicon nitride layer, in order, on said conductivity layer;

forming a photoresist pattern;

selectively etching said silicon nitride layer, said first oxide layer and said conductivity layer;

forming source/drain regions by an ion implantation process;

removing said photoresist pattern, thereby forming a first resulting structure;

forming an undoped polysilicon layer on the first resulting structure; and forming a spacer layer on a sidewall of said floating gate by applying an isotropic etching process to said undoped polysilicon layer so as to prevent said sidewall of said floating gate from being oxidized;

forming a second oxide layer on said silicon nitride layer, thereby forming a second resulting structure; and forming a control gate on the second resulting structure.

2. A method according to claim 1, wherein said conductivity layer is a doped polysilicon layer.

* * * * *